United States Patent [19]

Beinvogl

[11] Patent Number: 4,473,436
[45] Date of Patent: Sep. 25, 1984

[54] METHOD OF PRODUCING STRUCTURES FROM DOUBLE LAYERS OF METAL SILICIDE AND POLYSILICON ON INTEGRATED CIRCUIT SUBSTRATES BY RIE UTILIZING SF$_6$ AND CL$_2$

[75] Inventor: Willy Beinvogl, Munich, Fed. Rep. of Germany

[73] Assignee: Siemens Aktiengesellschaft, Berlin & Munich, Fed. Rep. of Germany

[21] Appl. No.: 490,481

[22] Filed: May 2, 1983

[30] Foreign Application Priority Data

May 5, 1982 [DE] Fed. Rep. of Germany ....... 3216823

[51] Int. Cl.$^3$ ................... H01L 21/28; H01L 21/308
[52] U.S. Cl. .................................. 156/643; 156/656; 156/657; 156/662; 204/192 E; 252/79.1
[58] Field of Search ............... 156/643, 656, 657, 662; 204/192 E; 252/79.1

[56] References Cited

U.S. PATENT DOCUMENTS

| | | | |
|---|---|---|---|
| 4,128,670 | 12/1978 | Gaensslen | 357/675 |
| 4,203,800 | 5/1980 | Kitcher et al. | 156/643 |
| 4,211,601 | 7/1980 | Mogab | 156/643 |
| 4,214,946 | 7/1980 | Forget et al. | 156/643 |
| 4,360,414 | 11/1982 | Beinvogl | 204/192 E |
| 4,380,489 | 4/1983 | Beinvogl et al. | 156/643 |
| 4,383,885 | 5/1983 | Maydan et al. | 204/192 E |
| 4,384,938 | 5/1983 | Desilets et al. | 204/192 E |
| 4,411,734 | 10/1983 | Maa | 156/656 |
| 4,414,057 | 11/1983 | Bourassa et al. | 156/657 |

FOREIGN PATENT DOCUMENTS

| | | | |
|---|---|---|---|
| 15403 | 8/1980 | European Pat. Off. | |
| 2098931 | 12/1982 | United Kingdom | 156/643 |

OTHER PUBLICATIONS

Murarka et al., "Refractory . . . Interconnects" IEEE J. of Solid-State Circuits, vol. SC15 No. 4, (8/80) pp. 474-482.

Tsai et al. "One-Micron . . . Technology" J. Electrochem. Soc. vol. 128 No. 10, (10/81) pp. 2207-2214.

Eisele, "SF$_6$, . . . Silicon" J. Electrochem. Soc., vol 128, No. 1, (1/81) pp. 123-126.

S. P. Murarka, "Refractory Silicides for Integrated Circuits", J. Vac. Sci. Technol., vol. 17, No. 4, (1980) pp. 775-788.

D. B. Fraser et al., "Tantalum Silicide/Polycrystalline Silicon-High Conductivity Gates for CMOS LSI Application", J. Vac. Sci. Technol., vol. 18, No. 2, (1981) pp. 345-346.

Primary Examiner—Jerome W. Massie
Attorney, Agent, or Firm—Hill, Van Santen, Steadman & Simpson

[57] ABSTRACT

The invention provides a method of producing structures from double layers composed of a metal silicide (4) and polysilicon (3) on a silicon substrate (1) containing integrated semiconductor circuits in an operational plate reactor by reactive ion etching and with the use of a photosensitive resist mask (5) on the double layer to define desired structures. The plate reactor is provided with a controlled reactive gas mixture which contains fluorine and chlorine. The double layer (3, 4) in preferred embodiments is composed of a tantalum silicide layer and a polysilicon layer. An insulating layer (2) can be provided between the substrate and the double layer. The invention is useful for providing low-resistant interconnects in VLSI circuits.

5 Claims, 8 Drawing Figures

METHOD OF PRODUCING STRUCTURES FROM DOUBLE LAYERS OF METAL SILICIDE AND POLYSILICON ON INTEGRATED CIRCUIT SUBSTRATES BY RIE UTILIZING SF<sub>6</sub> AND CL<sub>2</sub>

BACKGROUND OF THE INVENTION

1. Field of the Invention

The invention relates to production of circuit structures and somewhat more particularly to a method of producing structures from double layers composed of metal silicide/polysilicon (sometimes referred to as polycide) on silicon substrates containing integrated semiconductor circuits, which can be provided with an insulating layer between the polycide and the silicon substrate, and are produced by reactive ion etching in a plate reactor with a gas mixture containing a halogen and with the use of a photosensitive resist mask.

2. Prior Art

Metal silicides are gaining increasing significance in the production of large scale integrated MOS-circuits. One of the applications for metal silicide is its use as a low-resistant interconnect and gate material in a polysilicon gate process. With the proviso that polysilicon is not generally replaced by the silicide but, instead, augmented; namely in such a manner that the silicide is applied over a doped polysilicon layer. However, the production of fine structures from such double layers is a complex etching problem because a series of marginal conditions must be taken into consideration when producing integrated circuits.

The invention resolves this complex etching problem.

The marginal conditions which must be observed in an etching process when producing an integrated circuit will be discussed in greater detail on the basis of the illustration shown in FIG. 1. As shown, a silicon substrate 1 is provided with a SiO<sub>2</sub> layer 2, a n<sup>+</sup>-doped polysilicon layer 3, a silicide layer 4, a photosensitive resist layer 5 functioning as an etching mask, as well as with a polysilicon-1 gate structure 6 and an insulating oxide layer 7 positioned thereon.

Identical reference numerals are utilized throughout this discussion to designate identical parts in all of the figures.

The vertical arrows shown in FIG. 1 respectively point out an etching problem which is resolved in accordance with the principles of the invention.

Thus, arrow 10 indicates the desired, high selectivity to SiO<sub>2</sub> (layer 2) or some other equivalent insulator material. The layer thickness ratio of the polycide double layer (layers 3 and 4) to SiO<sub>2</sub> is up to 50:1.

Arrow 11 shows the attainment of a suitable edge shape or profile in etched structures. This can occur by anisotropic etching with vertical edges, as shown, or by slanted etching.

Arrow 12 indicates the step problem in a double polysilicon gate process, with the danger of electrical shorts due to etching residue at the polysilicon-1 edges (gate 6 and oxide 7).

Arrow 13 illustrates the formation of a contact polycide (layers 3 and 4) to a substrate (1), a so-called buried contact.

In addition to these conditions, which are met by the invention, the invention also allows use of a photosensitive resist mask which is not attacked during the etching process so as to be useful as an etching mask. Moreover, with the invention, a high uniformity of etching exists in all areas which is of importance because of the so-called short channel effect.

It is known from the prior art to etch structures of polysilicides, whereby molybdenum and tungsten silicides are etched in nearly all instances. There is only one known brief reference regarding etching tantalum silicide structures, which, in comparison to molybdenum and tungsten silicides, has considerable advantages because of better stability at high temperatures and good adhesion characteristics to polysilicon. J. Vac. Sci. Technol., Vol. 17, No. 4, (1980) pages 787–788 indicates that titanium, tantalum, molybdenum and tungsten silicides can be etched in a plasma with a carbon tetrafluoride/oxygen reactive gas mixture. The etching processes partially occur in a tunnel reactor and partially in a parallel-plate reactor with anodic coupling ("plasma etching"), (also see J. Vac. Sci. Technol., Vol. 18, No. 4, 1981, page 346). In principle, these layers can also be etched wet, but only with the loss of dimension, conventional with wet etching.

A number of techniques for plasma etching of polysilicon can be derived from Published European patent application No. 0 015 403 whereby gas mixtures consisting of sulfur hexafluoride ($SF_6$), chlorine ($Cl_2$) and an inert gas are utilized. However, with these methods, only silicon is selectively etched so that a very good selectivity in the presence of $SiO_2$ and silicon nitride is achieved. In addition, because of the reactive ion etching (the substrates to be etched are placed on an HF-conducting electrode of an operational reactor), a direct etching is also carried out so that the generated depressions have vertical side walls and the etching mask does not project beyond the edges of the so-etched depressions.

A method of the type initially described has been set forth in my U.S. Pat. No. 4,360,414, assigned to the instant assignee. With this method, sulfur hexafluoride is utilized as the reactive etching gas and the etching process is executed in two steps, each using different energy levels and having different etching rates.

SUMMARY OF THE INVENTION

The invention proceeds beyond the above described prior art for etching a metal silicide/polysilicon double layer (so-called polycide layer) and also provides a solution to the problem of slanted etching or, respectively, the step problem in a double polysilicon gate process without danger of electrical shorts of adjacent polycide innerconnects (see FIG. 1, arrows 11, 12 and 13).

In accordance with the principles of the invention, reactive ion etching occur in an operational reactor provided with a gas mixture which contains fluorine and chlorine as a reactive etching gas. If an etching gas containing only fluorine, such as sulfur hexafluoride, were utilized, then an overhang would be formed. On the other hand, the use of only chlorine as a reactive etching gas produces very low etching rates, particularly with tantalum silicide layers.

In preferred embodiments of the invention, a gas mixture containing sulfur hexafluoride ($SF_6$) and chlorine ($Cl_2$) is utilized as an etching gas. However, the invention can also be practiced by using gas mixtures which contain fluorohydrocarbons that are substituted with chlorine atoms (i.e. fluoro-chloro-carbons) such as monochloro-trifluoromethane ($CClF_3$), dichloro-difluoromethane ($CCl_2F_2$) and mixtures thereof. Further, a carrier gas, preferably an inert gas, such as helium, can also be utilized in the practice of the invention.

In an exemplary embodiment of the invention, a double layer is controllably etched and which consists of a tantalum silicide layer approximately 200 nm thick, with a tantalum:silicon ratio of about 1:2 and a n+-doped polysilicon layer which is approximately 300 nm thick.

In certain embodiments of the invention, when an underetching effect is desired, the etching occurs with a gas mixture containing sulfur hexafluoride and chlorine, with a mixing ratio of $SF_6:Cl_2$ in the mixture being adjusted to about 2:1, at a gas pressure of about 6 to 9 Pa, and an HF-power input to the reactor in the range of about 0.1 through 0.14 $W/cm^2$.

In certain embodiments of the invention, when an anisotropic etching is desired, the etching occurs with a gas mixture containing sulfur hexafluoride and chlorine, with the etching process being carried out in two steps, whereby the tantalum silicide layer 4 is first etched with the gas mixture having a mixing ratio of $SF_6:Cl_2$ in the gas mixture adjusted so as to be greater than about 3:1 and thereafter, the polysilicon layer 3 is etched with the gas mixture adjusted to have relatively pure chlorine therein.

In certain embodiments of the invention, when an underetching in the polysilicon layer 3 is desired, the etching occurs with the use of a gas mixture containing sulfur hexafluoride and chlorine, while a ratio of reaction gas volume in the reactor to the overall reactor volume is adjusted to less than about 1:20, and the mixing ratio of $SF_6:Cl_2$ in the gas mixture is adjusted to about 1:1. Different ratios of reaction gas volume to the overall reactor volume correspond to different reactor geometries.

In certain embodiments of the invention, when an underetching in a tantalum silicide layer (4) is desired, the etching occurs with the use of a gas mixture containing sulfur hexafluoride and chlorine while the ratio of an active reaction gas volume in the reactor to the overall reactor volume is adjusted to about 1:2 and the mixing ratio of $SF_6:Cl_2$ in the gas mixture is adjusted to about 1:1.

In certain embodiments of the invention, the reactive ion etching is executed before an annealing process, necessary for converting the double layer (layers 3 and 4) consisting of metal silicide/polysilicon into a crystalline state.

DESCRIPTION OF PREFERRED EMBODIMENTS

Figure 1:
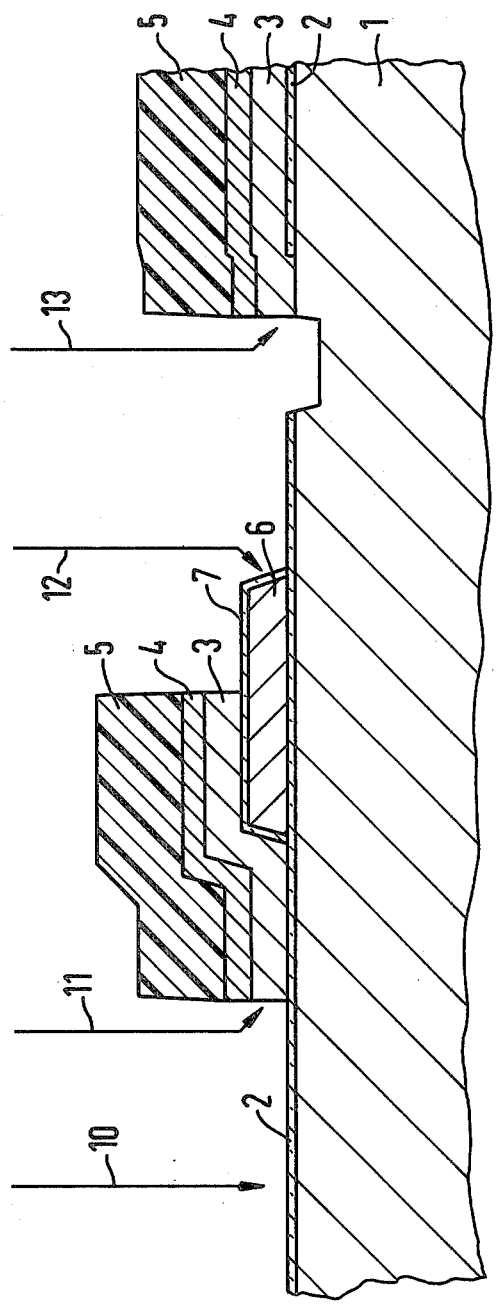
FIG. 1 is an elevated, partial, cross-sectional, view of an exemplary etched structure highlighting etching problems resolved in accordance with the principles of the invention.
Figure 2:
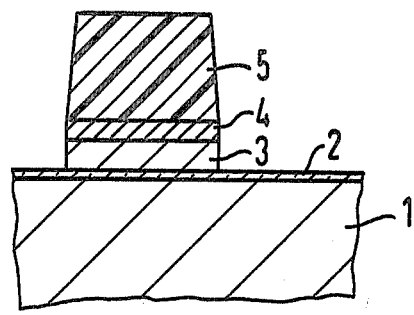
FIG. 2 is a somewhat similar view of an exemplary structure produced in accordance with the principles of the invention.

The structure partially illustrated at FIG. 2 comprises, somewhat similar to that described in conjunction with FIG. 1, a silicon substrate 1 having a 20 nm thick $SiO_2$ layer 2 thereon, with a 300 nm thick n+-doped (phosphorus or arsenic) polysilicon layer 3 on layer 2 and a 200 nm thick tantalum silicide layer 4 deposited on layer 3. A photosensitive resist layer 5, functioning as an etching mask, is positioned on layer 4. The tantalum:silicon ratio in layer 4 is about 1:2 (fluctuations of the Ta:Si ratio can occur, with about 30% to 50% Ta). The structure illustrated in FIG. 2 is one in which the goal was to achieve a strictly anisotropic etching. Such etching can be achieved, for example, by a two-step etching process in that the tantalum silicide layer 4 is first etched with a relatively low amount of chlorine in the etching gas (i.e. with a $SF_6/Cl_2$-containing gas mixture, at a mixing ratio of $SF_6:Cl_2$ of greater than about 3:1) and subsequently the polysilicon layer 3 is etched in relatively pure chlorine (with or without an inert carrier gas). In this manner, structured silicide-polysilicon double layers can be obtained free of undercuttings with vertical edges, as illustrated in FIG. 2. The changeover from the first etching step to the second etching step can be reliably determined, for example, by recording the intensity of a suitable emission line of the plasma. At the same time, a very high selectivity of poly-Si to $SiO_2$ of greater than about 30:1 can be achieved in the second step (with relatively pure $Cl_2$).

All structures described herein were obtained by positioning suitably prepared substrates having a double layer polycide thereon, with or without an insulating layer being provided between the substrate and the double layer, and a suitably developed photosensitive resist mask on the double layer to define desired structures, in an operational plate reactor (i.e. coupled to a controllable HF-power source, having gas inlets connected to select controllable gas sources and gas outlets connected to controllable vacuum pumps for maintaining a select gas pressure within the reaction space of the reactor). Such operational plate reactors are well known in the art and need not be described further.

Figure 3:
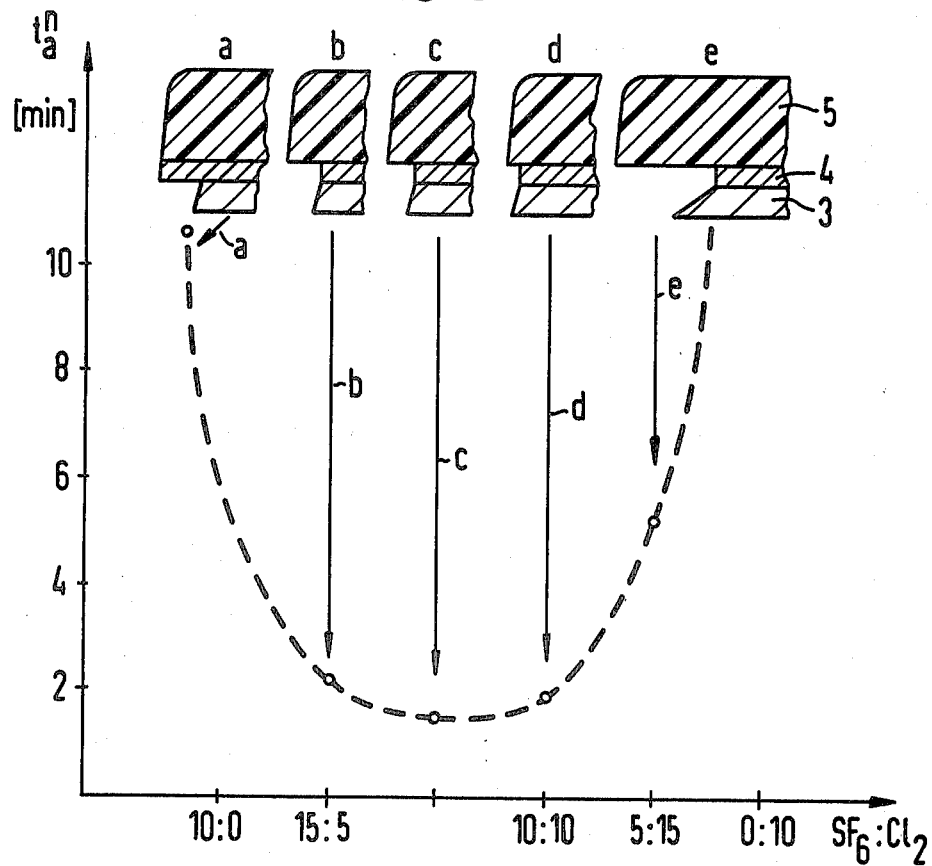
FIGS. 3, 4 and 5 are elevated, partial, cross-sectional views of exemplary etched structures obtained by the use of optimum etching conditions (mixing ratio of reaction gases, etching times, gas pressure and HF-power) obtained by utilizing the principles of the invention and graphically illustrating in association with each respective structure.

Changes in the edge profiles of the double layers 3, 4 in relation to the composition of the reactive etching gas can be seen from FIG. 3. In the illustrated graph, the various mixing ratios of $SF_6:Cl_2$ are entered along the abscissa and the etching times, $t_n{}^a$, for the double layer is entered along the ordinate. The broken-line curve illustrated in FIG. 3 shows the dependency of the etching time on the gas composition. The structure a illustrates a structure etched without a chlorine component in the etching gas with a high etching time (see arrow a). The structure b has a relatively low etching time (see arrow b). The structure c has the lowest etching time, with a $SF_6:Cl_2$ mixing ratio of about 2:1. Although structure c is noticeably underetched, it is still quite usable in terms of its profile. Structure e was obtained with a $SF_6:Cl_2$ mixing ratio of about 5:15. In this instance, the silicide layer 4 was underetched to a relatively high degree. A significantly better anisotropy for a SF$_6$:Cl$_2$ mixing ratio of 5:15 can be obtained with a lower gas pressure (i.e., about 10 mTorr, which is equal to about 1.5 Pa) in the etching atmosphere.

The various structures shown in FIG. 3 were etched in an etching atmosphere contained within an operational reactor having a gas pressure adjusted in the range of about 6 through 9 Pa (40 through 60 mTorr) and which was provided with an HF-power input of about 0.12 W/cm$^2$.

Figures 4, 5:
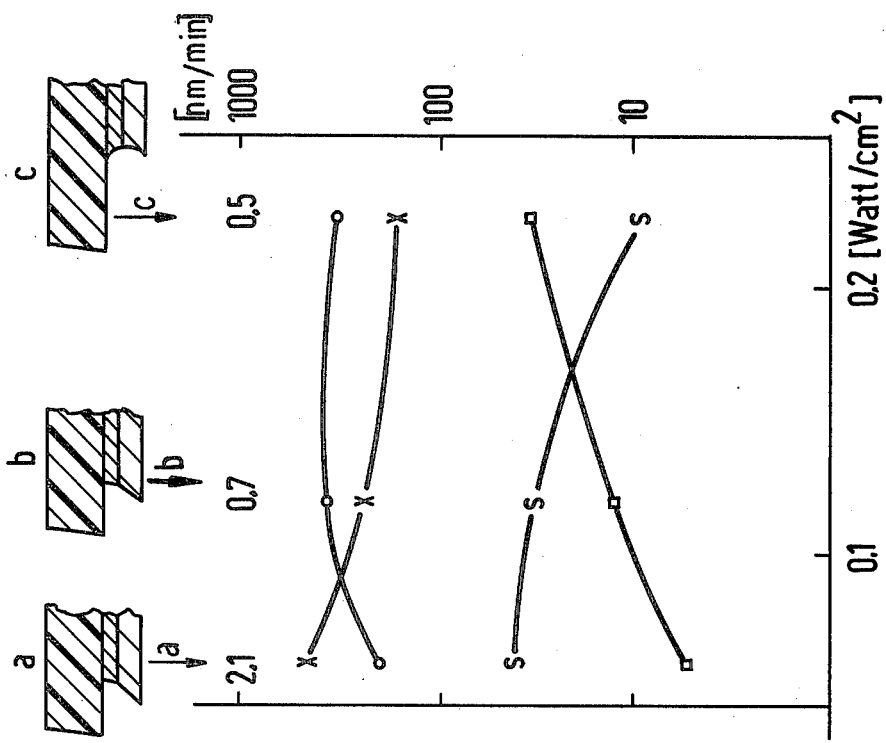

In FIGS. 4 and 5, the etching rate in nm/min units is entered along the ordinate as a function of gas pressure in Pa units (FIG. 4) and as a function of HF-power in watts/cm$^2$ units (FIG. 5) along the abscissa. The respective arrows, a, b and c, denote the conditions under which the illustrated structures a, b, c, were obtained. The arrow b (in FIGS. 4 and 5) for the respective structures b obtained with the most favorable conditions is more greatly emphasized. With the diagram illustrated in FIG. 4, an HF-power input of 0.1 W/cm$^2$ was provided to the reactor. The gas atmosphere within the reactor was composed of a mixture of SF$_6$:Cl:He with a mixing ratio of about 12.5:6.5:20. The x-dashed curve applies to tantalum silicide layer, the o-dashed curve applies to the polysilicon layer, the □-dashed curve applies to the SiO$_2$ layer and the s-dashed curve illustrates the selectivity of polysilicon:SiO$_2$.

The same designations also apply to the curve diagrams illustrated in FIG. 5, which shows the dependency of etch rate (nm/min) on the HF-power density (watts/cm$^2$). The gas pressure in the reactor was about 40 mTorr.

Figure 6:
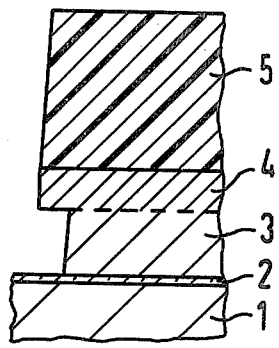
FIGS. 6 and 7 are elevated, partial, cross-sectional views of exemplary etched structures obtained by utilizing different volume ratios (active volume:reactor volume) in accordance with the principles of the invention.
Figure 7:
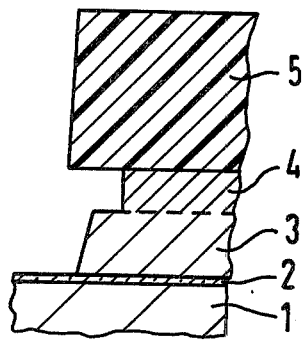

During the development of the invention, it was determined that, with a constant gas mixture, the etching profile of a structure also depends quite sensitively on the reactor geometry and on the ratio of active reaction gas volume or plasma volume to the overall volume of the reactor. This ratio apparently influences the concentration distribution of the various radicals in the plasma. In producing a structure having the etched profile shown in FIG. 6, a ratio of active reaction gas volume to the overall reactor volume of less than about 1:20 existed, whereas this ratio was approximately 1:2, i.e. the plasma volume corresponded to about half of the reactor volume, during production of a structure having the etch profile shown in FIG. 7. A significant difference between these ratios is that, in the former instance (FIG. 6) the silicide layer 4 can be etched anisotropically relative to the photosensitive resist mask 5 at all SF$_6$:Cl$_2$ ratios. In the second instance (FIG. 7) the silicide etching behavior can be varied by varying the mix ratio of the reactive etching gases from anisotropic up to substantially underetching (see FIG. 3).

Figure 8:
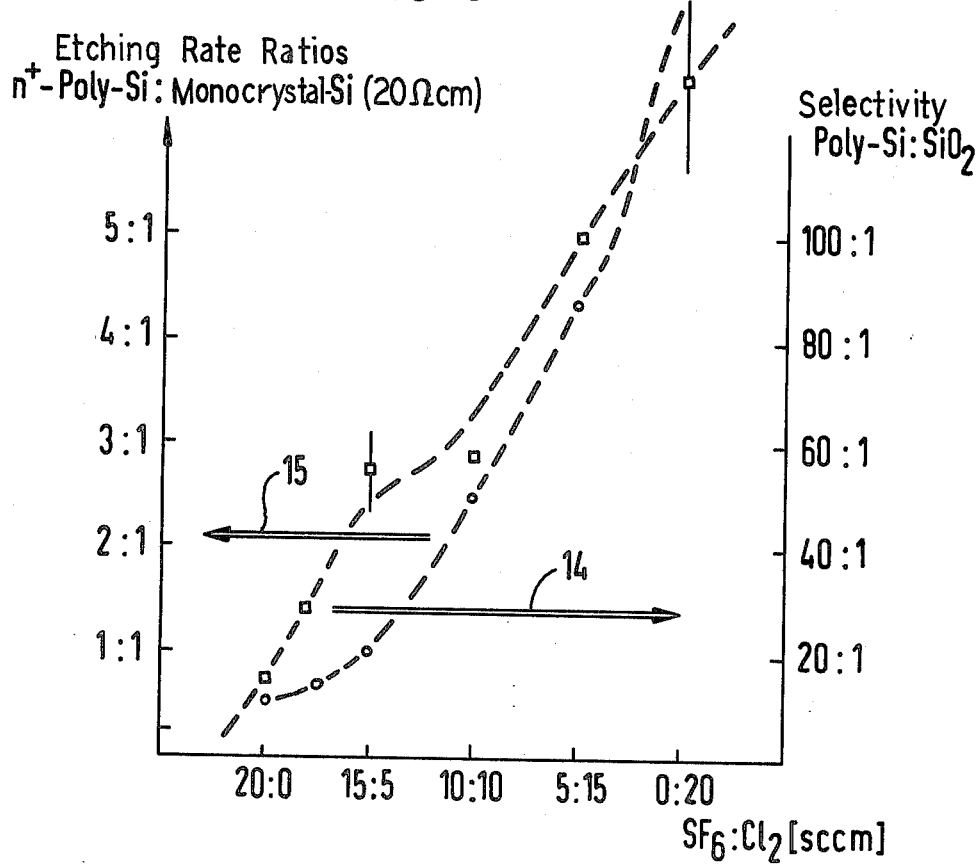
FIG. 8 is a graphical illustration of the etching rate ratio obtained in the practice of the invention between n+-doped polysilicon and monocrystalline silicon or, respectively, the selectivity of polysilicon to $SiO_2$ as a function the reactive gas mixture.

When a polycide layer (composed of polysilicon layer 3 and a silicide layer 4) is to topically have a contact with a silicon substrate (buried contact), then a certain degree of incipient etching of the substrate cannot, of course, be avoided (see FIG. 1, arrow 13). At the end of the production process of a circuit, this can lead to increased contact resistance between the polycide and the substrate and topographical problems. However, with a correct selection of the fluorine/chlorine ratio in a reactive etching gas, one can achieve a relatively high selectivity (up to about 100:1) of n$^+$-polysilicon:silicon substrate and, thus, keep the incipient etching of a substrate very low. These relationships can be derived from the illustration in FIG. 8. The diagram shows the etching rate ratio for n$^+$-Poly-Si (polysilicon): monocrystalline (20Ω cm) or, respectively, the selectivity between n$^+$-polysilicon:SiO$_2$ as a function of reactive gas mixing ratio in sccm units (standard cm$^3$ per min; standard being defined at atmospheric pressure and a defined temperature). The curve associated with arrow 14 applies to the selectivity while the curve associated with arrow 15 applies to the etching rate ratios. The illustrated □ and o markings represent measuring points. As can be seen, the most favorable range lies at a reactive gas mixing ratio for SF$_6$:Cl$_2$ between about 5:15 and 2:18.

In accordance with the principles of the invention, structuring of the polysilicide (layers 3 and 4) can occur before an annealing process, by which the silicide is converted into a polycrystalline and low resistant material. It has been noted that the boundary surface of a silicide/polysilicon layer is far more homogenous before annealing, i.e. it is not as rough, as after annealing. This has the advantage that the changeover point when etching in a two-step process can be better defined.

As is apparent from the foregoing specification, the present invention is susceptible of being embodied with various alterations and modifications which may differ particularly from those that have been described in the preceding specification and description. For this reason, it is to be fully understood that all of the foregoing is intended to be merely illustrative and is not to be construed or interpreted as being restrictive or otherwise limiting of the present invention, excepting as it is set forth and defined in the hereto-appended claims.

I claim as my invention:

1. In a method of producing structures from double layers consisting of metal silicide/polysilicon on a silicon substrate containing integrated semiconductor circuits by a reactive ion etching in an operational plate reactor with the use of a reactive gas mixture and a photosensitive resist mask to define desired structures, wherein the improvement comprises:

utilizing as said reactive gas mixture a mixture of sulfur hexafluoride and chlorine, and
   carrying out reactive ion etching of the double layers in said plate reactor to obtain the desired structures.

2. In a method of producing structures from tantalum silicide-polysilicon double layers on silicon substrates containing integrated semiconductor circuits by reactive ion etching in an operational plate reactor with a reactive gas mixture, the improvement which comprises:

producing an underetching effect by using a reactive gas mixture of sulfur hexafluoride and chlorine at a mixing ratio of about 2:1, a gas pressure in said reactor of about 6 to 9 Pa, and a power input to the reactor of from about 0.1 to 0.14 W/cm$^2$.

3. In a method of producing structures from tantalum silicide-polysilicon double layers on silicon substrates containing integrated semiconductor circuits by reactive ion etching in an operational plate reactor with a reactive gas mixture, the improvement which comprises:

producing an anisotropic etching effect by using a reactive gas mixture of sulfur hexafluoride and chlorine, the etching process being carried out in two steps with the layer of tantalum silicide being etched first with a ratio of SF$_6$:Cl$_2$ in the gas mixture of greater than 3:1 and thereafter etching the layer of polysilicon with substantially pure chlorine gas.

4. In a method of producing structures from tantalum silicide-polysilicon double layers on silicon substrates containing integrated semiconductor circuits by reactive ion etching in an apertured plate reactor with a reactive gas mixture, the improvement which comprises:

producing an underetching in the polysilicon layer by using a ratio of active reactive gas volume in said reactor to overall reactor volume of less than about 1:20, and employing a mixing ratio of $SF_6:Cl_2$ of about 1:1.

5. A method according to claim 4 wherein underetching in the layer of tantalum silicide is achieved using a ratio of reactive gas volume in said reactor to overall reactor volume of about 1:2.

* * * * *